United States Patent [19]

Dahringer

[11] Patent Number: 5,107,330
[45] Date of Patent: Apr. 21, 1992

[54] SELF-ADJUSTING HEAT SINK DESIGN FOR VLSI PACKAGES

[75] Inventor: D. W. Dahringer, Glen Ridge, N.J.

[73] Assignee: AT&T Bell Laboratories, Murray Hill, N.J.

[21] Appl. No.: 599,948

[22] Filed: Oct. 19, 1990

[51] Int. Cl.⁵ .................... H01L 23/02; H01L 23/42; H01L 23/44; H01L 23/46
[52] U.S. Cl. ........................................ 357/81; 357/79; 357/80; 361/386; 165/80.2
[58] Field of Search .................. 357/81, 80, 79; 361/386; 165/80.2

[56] References Cited

U.S. PATENT DOCUMENTS

| | | | |
|---|---|---|---|
| 4,408,220 | 10/1983 | Calabro | 357/81 |
| 4,479,140 | 10/1984 | Horvath | 357/81 |
| 4,508,163 | 4/1985 | McCarthy | 165/80 B |
| 4,605,986 | 8/1986 | Bentz et al. | 361/386 |
| 4,712,159 | 12/1987 | Clemens | 361/386 |
| 4,849,856 | 7/1989 | Funari et al. | 361/386 |

*Primary Examiner*—Rolf Hille
*Assistant Examiner*—David Ostrowski
*Attorney, Agent, or Firm*—Oleg E. Alber

[57] ABSTRACT

The present invention is an electronic circuit, such as a Hybrid Integrated Circuit (HIC), having an element mounted on a suitable support base, and a self-adjusting heat sink mounted on the element. A heat spreader is located in spaced relationship with the support base. The heat spreader may be a plate of conductive material provided especially or may form a part of a housing enclosing the HIC. The heat sink has a bottom portion secured to the element and at least one flange for conducting heat energy to the heat spreader. Each flange includes an upright segment projecting from the bottom portion of the heat sink toward the heat spreader, a free end segment bent away from the heat spreader and a knee-bend segment intermediate the upright segment and the free-end segment and adjacent to the heat spreader. Each flange is also provided with a thermally responsive section, hereinafter referred to as "thermostat", which forms a part of the upright segment and in response to the presence or absence of a certain amount of heat energy causes movement of the free end segment of the heat sink, respectively, toward or away from the heat spreader so as to establish a greater or lesser area of contact with the heat spreader. This thermostat is formable in several ways including inlaying into an upright segment of the flange a metal with a coefficient of thermal expansion different from that of the flange or by attaching such a metal to the upright segment.

11 Claims, 2 Drawing Sheets

SELF-ADJUSTING HEAT SINK DESIGN FOR VLSI PACKAGES

TECHNICAL FIELD

This invention concerns with heat-sinks for removal of variable amounts of heat from elements of the electronic circuits, such as Hybrid Integrated Circuits (HICs).

BACKGROUND OF THE INVENTION

Hybrid Integrated Circuits (HIC) often include active chips, such as Integrated Circuit (IC) chips, or some other elements or devices which during operation either generate heat or are subjected to heat generated by other elements of the HIC. Some of the devices may be susceptible to heat-induced changes in operating characteristics or other heat-induced damage, such as warping, separation, wire breakage, fracture, etc. These adverse effects may become more pronounced in circuits, in which the elements are densely clustered. Thus, it is desirable to remove excess heat from at least some of the individual elements of the HICs by providing them with "heat-sinks" of a high heat-conductivity metal to pick-up and transfer the heat away from these elements. In some instances, it may be desirable to remove a variable amount of heat. For example, when an element or a device is programed to operate at a certain temperature or when the circuitry is in a cold environment, removal of an excess amount of heat could adversely affect the operational characteristics of the element or device. Therefore, it may be desirable to remove heat only when a certain temperature level is reached which is in excess of the normal operating temperature of the element or device.

U.S. Pat. No. 4,408,220 issued to A. D. Calabro on Oct. 4, 1983 discloses a heat-dissipator (a heat sink) structure including top and bottom metal plates interconnected by an intermediate metal section. This structure is formed so as to be slidably mounted on an IC package which is mounted on a support base, such as a printed circuit board. The top plate of the heat-sink is resiliently connected to the intermediate section and when in position contacts a heat spreader plate common to a number of such heat-sinks. However, with further miniaturization and automation of manufacture and assembly, such a mechanically secured heat-sink may prove difficult to use. Furthermore, that heat sink is not programmed for variable heat transfer from the IC to the heat spreader.

It is, thus, desirable to provide HICs with a heat-sink attached to an element such as a chip or some other device and capable of transferring varied amounts of heat energy to a heat spreader or dissipator in response to a correspondingly varied temperature of the element or device or environment so as to stabilize the operating temperature of the HIC.

SUMMARY OF THE INVENTION

The present invention is an electronic circuit, such as a Hybrid Integrated Circuit (HIC), having an element mounted on a suitable support base, and a heat sink mounted on the element. A heat spreader is located in spaced relationship with the support base. The heat sink has a bottom portion and at least one flange for conducting heat energy to the heat spreader. The bottom portion is secured to the element. Each flange includes an upright segment projecting from the bottom portion of the heat sink toward the heat spreader, a free end segment bent away from the heat spreader and a knee-bend segment intermediate the upright segment and the free-end segment and adjacent to the heat spreader. Each flange is also provided with a thermally responsive section, hereinafter referred to as "thermostat", which forms a part of the upright segment and in response to the presence or absence of a certain amount of heat energy causes movement of the free end segment of the heat sink, respectively, toward or away from the heat spreader so as to establish a greater or lesser area of contact with the heat spreader. This thermostat is formable in several ways including inlaying into an upright segment of the flange a metal with a coefficient of thermal expansion different from that of the flange or by attaching such a metal to the upright segment.

DETAILED DESCRIPTION

Figure 1:
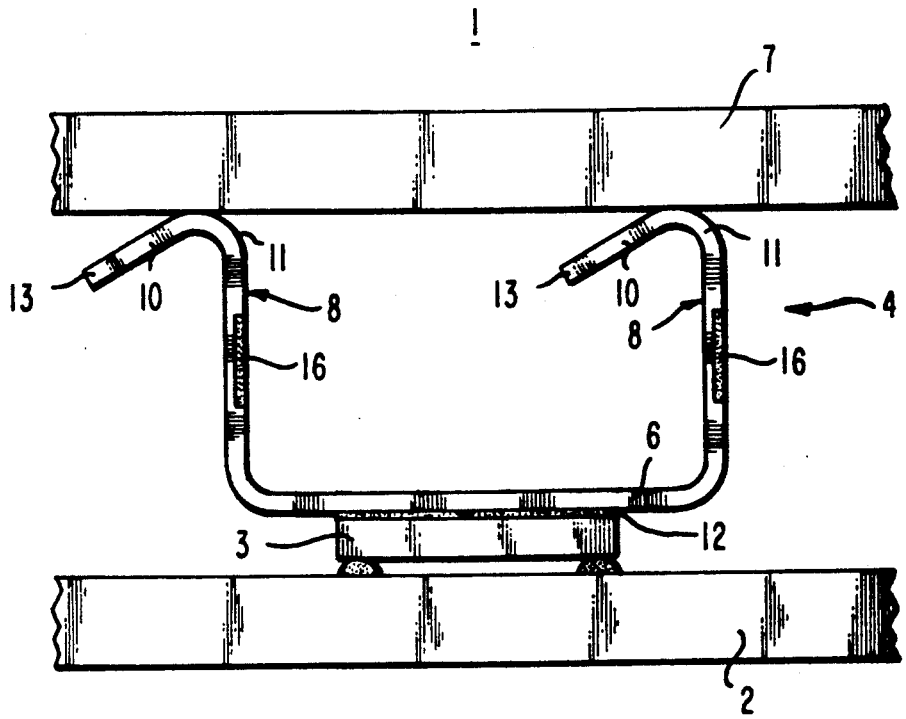
FIG. 1 is a cross-sectional view of one variant of an exemplary device constructed in accordance with the present invention.

Reference numeral 1 designates an exemplary electronic circuit, such as a Hybrid Integrated Circuit, only a portion of which is shown. Reference numeral 2 designates a support base made of a suitable material such as ceramic, semiconductor (e.g. silicon), glass, plastic (e.g. epoxy, glass fiber-reinforced epoxy, resin coated metal (e.g. epoxy coated aluminum), molded circuit board and other suitable conventionally used materials. Reference numeral 3 designates an element or device mounted on the support base. In an exemplary embodiment, element 3 is an active semiconductor chip, such as an Integrated Circuit (IC) chip. The chip is mounted on the support base in a so-called "flip-chip" manner in conductive contact between any circuitry (not shown) on the chip and conductive leads and pads (not shown) on the support base. The chip is secured to the support base in a conventional manner such as by solder, alloying, gold eutectic bonding, conductive adhesive and the like.

A heat-sink, identified generally by numeral 4, is attached to an upper or non-active surface of the chip, that is to that surface of the chip which is opposite the surface facing the support base. Alternatively, the support base may, in fact, be a base of the thermostat, and the now free active surface of the IC chip can be wire bonded to a lead frame. The heat-sink is of a suitable metal or alloy having high heat conductivity, such as aluminum, copper, nickel, their alloys, brass, bronze, stainless steel. Noble metals or their alloys, such as gold, palladium, platinum, or silver, can be used. The metal should not lead to contamination of the element.

The heat sink is provided with a bottom portion, 6, attached to the chip, and at least one flange, 8, for conducting heat to a heat spreader, 7, which is positioned a spaced distance from support base 2. In the exemplary embodiment, the heat sink has a U-shaped configuration and has at least two flanges 8. Each flange includes an upright segment 9, projecting from bottom portion 6, a free end segment, 10, and a knee-bend segment, 11. Bottom portion 6 of the heat-sink is secured to the upper or non-active surface of chip 3 by suitable means such as an adhesive, 12, having suitable temperature and processing characteristics. Free end segment 10 of each flange 8 is at an acute angle to the respective upright segment 9, so that each free end, 13, points normally toward support base 2. The knee-bend segment 11 of each flange is placed near or in contact with heat spreader 7. Heat spreader 7 is also of a high heat conductivity metal, such as aluminum, copper, nickel, their alloys, brass, bronze, stainless steel, provided to pick-up heat from the heat sink(s) and to conduct away or dissipate the heat to the environment. The heat spreader may be a plate provided especially for this purpose or it may form a part of a housing enclosing the HIC.

Each flange 8 is provided with a thermostat which automatically controls an area of contact between free end segment 10 and heat spreader 7. The thermostat, is preferably, located between bottom portion 6 and knee-bend segment 11; however, some other positioning of thermostat on the heat-sink, such as on each respective free-end segment 10 is possible. The thermostat is programmed to cause movement of free end segment 10 toward heat spreader 7 from its normal position at an acute angle of less than 45° to the heat spreader. Depending on operating conditions, and thus, the temperature of the environment, the free end segment will move toward contacting position with heat spreader or shall move away from the heat spreader toward its normal position.

The thermostat is comprised of two metals and/or alloys having different thermal coefficients of expansion (TCE) forming a bimetallic element. Materials of this construction are obtainable commercially, and would undergo predictable bending as a function of temperature, physical design, and materials. Some of suitable materials and their respective coefficients of thermal expansion ($\alpha$) for a temperature range of from 32° F. to 212° F. are given in TABLE I below:

TABLE I

| Metal | $\alpha$(ppm/°F.) | Metal | $\alpha$(ppm/°F.) |
| --- | --- | --- | --- |
| Al | 11.5–13.7 | Kovar | 3.3 |
| Cu | 9.3 | Monel | ~15 |
| Ag | 10.5–10.6 | Stainless steel 416 | 9.9 |
| Au | 7.9 | Stainless steel 303 | 17.4 |
| Pt | 5.0 | Al alloy | ~23 |
| Pd | 6.5 | Phosporbronze | 9.9 |
| Ni | 7.1 | Invar | 0.8–0.9 |
| Brass | 9.8–11 | | |

The thermostat may be formed in a number of variants. For example, in one variant, shown in FIG. 1, an inlay, 16, of a metal having one value of TCE, $\alpha_1$, is embedded into upright segment 9 of a metal having another TCE value, $\alpha_2$; in another variant, shown in FIG. 2, a thin platelet, 17, of a metal having said one TCE value $\alpha_1$, is attached to upright segment 9 constructed of a metal having said another TCE value, $\alpha_2$, in a conventional manner such as by soldering, alloying or adhesively, e.g., by means of an epoxy composition. One example of a pair of metals forming the thermostat could be aluminum for the heat sink and Invar for the inlay. Other variants may include a bimetallic composite which may be inlayed into or attached to upright segment 9.

Figure 2:
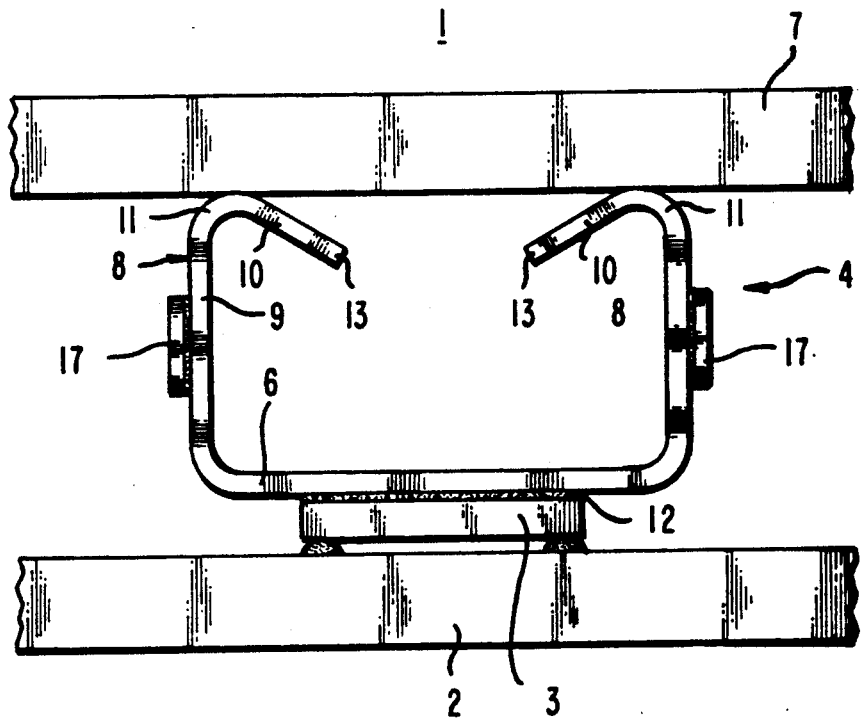
FIG. 2 is a cross-sectional view of another variant of the exemplary device constructed in accordance with the present invention.

In the two embodiments shown in FIGS. 1 and 2, the TCE, $\alpha_1$, of inlay 16 or platelet 17 is smaller than the TCE, $\alpha_2$, of the material of upright segment 9 ($\alpha_1 < \alpha_2$). This disparity in TCEs will result, upon being subjected to a certain increase of temperature, in greater expansion of the metal of upright segment 9 than of inlay 16 (or platelet 17), causing movement of free end 13 toward heat spreader 7. By properly selecting the respective TCEs of the two metals as well as the respective physical dimensions of the metal with smaller TCE value, it is possible to preselect the sensitivity of the heat sink to a certain value of temperature.

The thermostats may be arranged on the heat sink in a suitable preselected arrangement. For example, they may be both positioned on the outside of each respective upright segments 9, as shown in FIG. 2, both on the inside (not shown) of the upright segments or may be positioned on the same side of each upright segment, such as on the right-hand side as shown in FIG. 1 or on the left-hand side (not shown) with free end of one flange pointing in a direction opposite to the free end of the other flange.

Positioning of inlays 16 or platelets 17 relative to the heat sink, determines the direction in which the respective free ends 13 will be facing and/or the response to increased heat flow. For TCEs with $\alpha_1 < \alpha_2$, positioning of the platelets 17 on the outside of the heat sink, as is shown in FIG. 2, requires free ends 13 to be on the inside of the heat sink. A similar situation would arise if both inlays 16 were on the outside of the heat sink. Positioning of both inlays 16 or platelets 17 on the inside of the heat sink and $\alpha_1 < \alpha_2$ would require free ends 13 to face outwardly of the heat sink. Other arrangement would result either in configuration shown in FIG. 1, or with opposite positioning of inlays 16 or platelets 17 in a configuration (not shown) opposite to that of FIG. 1. Similarly, a different relation in respective TCEs (e.g. $\alpha_1 < \alpha_2$) could lead to other predictable arrangements. These variations in configurations could be useful in designing an architecture of a circuit including devices with such heat sinks.

Figure 3:
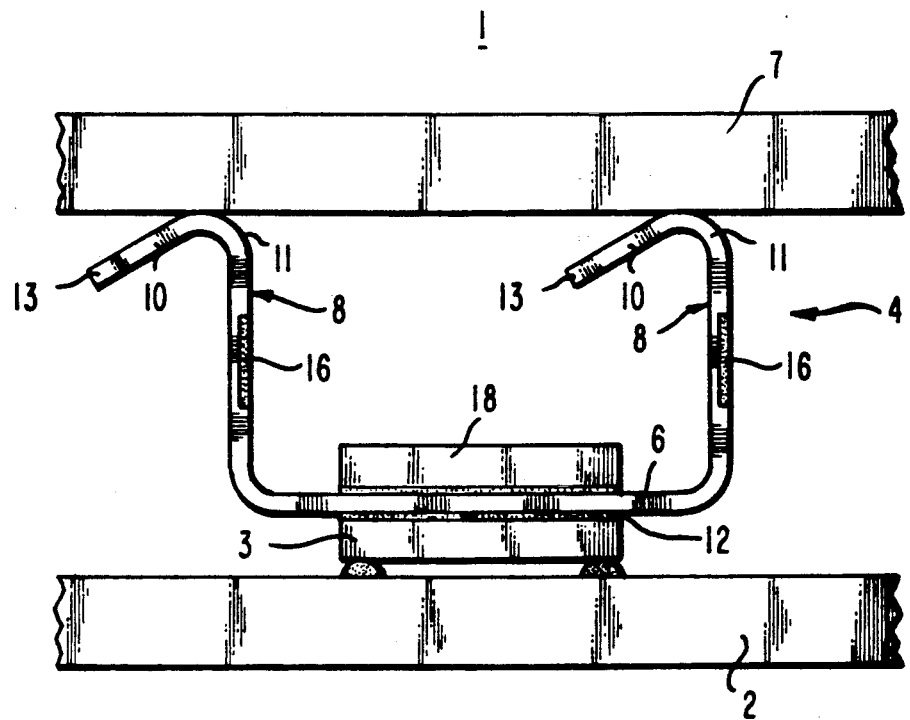
FIG. 3 is a cross-sectional view of said one variant of the exemplary device provided with a thermally balancing insert.
Figure 4:
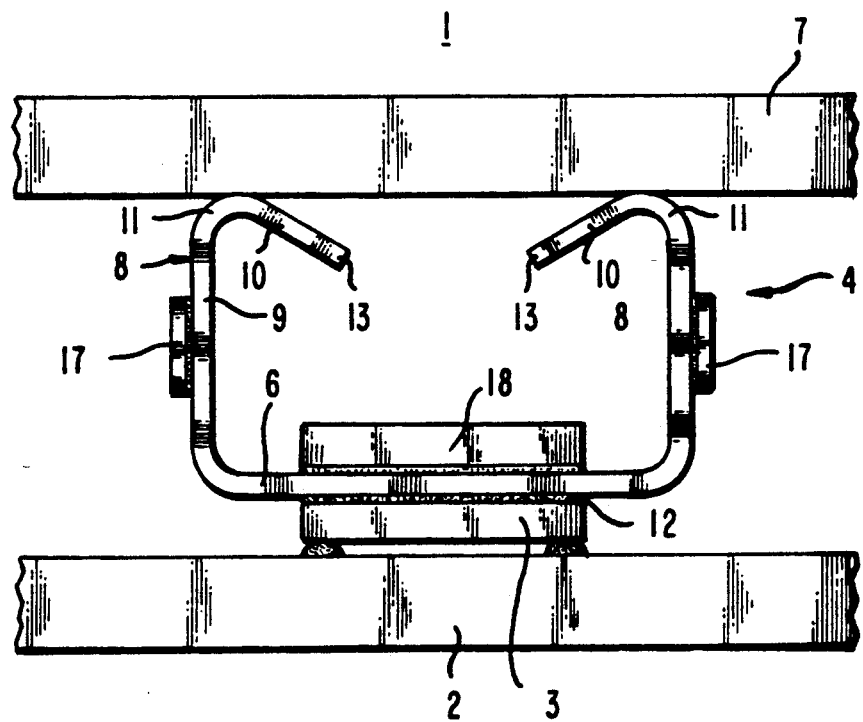
FIG. 4 is a cross-sectional view of said another variant of the exemplary device provided with a thermally balancing insert.

The structure may additionally be stabilized against possible warpage and/or delamination damage due to the disparity between the TCE of heat sink 6 and TCE of element 3. One efficient manner for achieving the stabilization is disclosed in the co-pending application U.S. Ser. No. 599,948 filed on Oct. 19, 1991 which is incorporated herein by reference. Use of that invetion is shown in FIGS. 3 and 4 wherein similar numbers identify similar parts already disclosed in connection with FIGS. 1 and 2. The stabilization is achieved by placing onto the bottom portion 6 and within heat sink 4 a stress-balancing insert, 18, having a TCE different from the TCE of the material of the heat sink and, preferably, equal to the TCE of the material of element 3. The stress-balancing insert may be of the same material as element 3, e.g. it may be a semiconductor chip, such as a "dummy" chip or may be of another suitable material with a TCE different from or equal to the TCE of element 3. The insert may be secured to bottom portion 6 of he heat sink in any conventional fashion, such as by means of an adhesive which is preferably similar to adhesive 12.

It is to be understood that the above-described embodiments are simply illustrative of the principles of the invention. Various other modifications and changes may be devices by those of average skill in the art, which will embody the principles of the invention and fall within the scope and spirit thereof.

I claim:

1. An article comprising
an element mounted on a surface of a support base,
a heat spreader arranged at a spaced distance from the element for dissipating heat energy,
a heat sink arranged between the element and the heat spreader for conducting the said heat energy from the element to the heat spreader, the heat sink being of a high heat-conductivity material, the heat sink has a bottom portion attached to the element and at least one heat-conducting flange for conducting the heat energy to the heat spreader, each heat-conducting flange including
a) an upright segment projecting from the bottom portion of the heat sink,
b) a free-end segment arranged at an acute angle to the upright segment and normally pointing away from the heat spreader,
c) a knee-bend segment interconnecting the upright segment and the free-end segment, and
d) a thermally responsive section for causing movement of the free-end segment relative to the heat spreader in response to a change in temperature being conducted wherein said thermally responsive section is a thermostat formed by a metal having a preselected coefficient of thermal expansion, $\alpha_2$, and another metal having a different preselected coefficient of thermal expansion $\alpha_1$, wherein $\alpha_1$ and $\alpha_2$ are preselected to cause said movement of the free end relative to the heat spreader in response to a temperature change relative to an operating temperature.

2. The article of claim 1 in which said another metal is an inlay in said upright segment.

3. The article of claim 1 in which said another metal is in the form of a platelet attached to said upright segment.

4. The article of claim 1 in which said thermostat causes the free end segment to be in maximum contact with the heat spreader in response to a preselected value of temperature.

5. The article of claim 1 in which $\alpha_1 < \alpha_2$, and the metal with $\alpha_1$ is on the side of the upright segment opposite the free-end segment.

6. The article of claim 1 in which the knee bend segment is in contact with the heat spreader.

7. The article of claim 1 in which the heat-sink has a U-shaped cross-section.

8. The article of claim 1 in which the heat-sink has a plurality of flanges.

9. The article of claim 1 in which the metal of the heat sink is selected from the group of metals consisting of aluminum, copper, nickel, bronze, brass, stainless steel.

10. The article of claim 1 in which said another metal is selected from the group of metals consisting of Kovar, Invar, Monel, and Nickel.

11. The article of claim 1 in which the material of the heat sink comprises aluminum and the material of the other metal forming the thermostat is Invar.

* * * * *